United States Patent [19]

Zucchi et al.

[11] 4,375,290

[45] Mar. 1, 1983

[54] SLIDING COMPRESSION AIR SEAL FOR REMOVABLE ELECTRONIC UNITS

[75] Inventors: Alfred A. Zucchi, Severna Park; Frank E. Altoz, Baltimore; John W. Hughes, Columbia, all of Md.

[73] Assignee: Westinghouse Electric Corp., Pittsburgh, Pa.

[21] Appl. No.: 209,555

[22] Filed: Nov. 24, 1980

[51] Int. Cl.³ .................... F16J 15/10; H05K 7/20; H05K 7/14
[52] U.S. Cl. .................................. 277/12; 277/228; 277/152; 277/DIG. 6; 277/DIG. 7
[58] Field of Search .............. 277/12, 32, 152, 153, 277/227, 228, 233, DIG. 7; 361/381–384, 395, 415

[56] References Cited

U.S. PATENT DOCUMENTS

| | | | |
|---|---|---|---|
| 2,859,061 | 11/1958 | Reid | 277/228 |
| 2,868,575 | 1/1959 | Hawxhurst | 277/228 |
| 2,932,535 | 4/1960 | Peickii et al. | 277/152 X |
| 3,382,476 | 5/1968 | Novet | 174/101 X |
| 3,495,132 | 2/1970 | Anhalt et al. | 361/384 X |
| 4,107,760 | 8/1978 | Zimmer | 361/383 |
| 4,277,815 | 7/1981 | Skroupo | 361/383 |

FOREIGN PATENT DOCUMENTS

| | | | |
|---|---|---|---|
| 136065 | 6/1979 | German Democratic Rep. | 277/12 |
| 803997 | 11/1958 | United Kingdom | 277/227 |

*Primary Examiner*—Robert S. Ward, Jr.
*Attorney, Agent, or Firm*—R. M. Trepp

[57] ABSTRACT

The compression air seal for containing air between equipment racks and electronic modules is described incorporating a metal base having a slot opening and an inclined or tapered upper surface with respect to the lower surface, a double layer of elastomeric material having two hardness values one upon the other in enclosing the opening and a coating of low-friction material over the upper elastomeric material to facilitate low friction when an electronic module having a tapered surface is slid over and compresses the seal.

20 Claims, 12 Drawing Figures

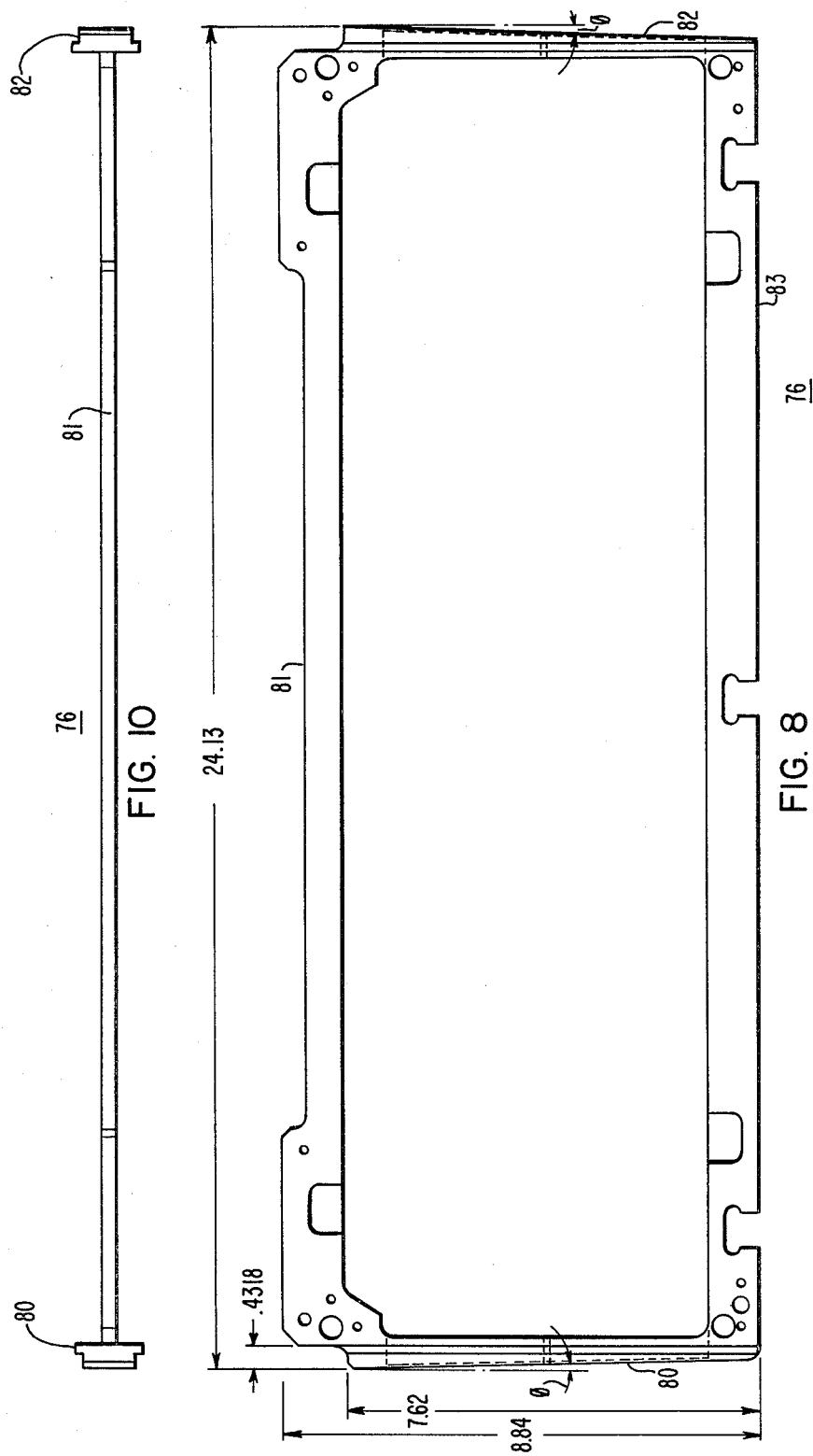

SLIDING COMPRESSION AIR SEAL FOR REMOVABLE ELECTRONIC UNITS

GOVERNMENT CONTRACT

The Government has rights in this invention pursuant to Contract No. F33657-79-C-0040 awarded by the Department of the Air Force.

CROSS-REFERENCE TO RELATED APPLICATION

This application is cross-referenced to an application entitled "REPLACEABLE AIR SEAL FOR FORCED COOLED REMOVABLE ELECTRONIC UNITS" by J. D. Skroupa having Ser. No. 049,007 filed on June 15, 1979, now U.S. Pat. No. 4,277,815, which describes a replaceable air seal for sealingly engaging the internal surfaces of a printed wiring assembly to direct cooling air in the space between the boards. The air seal incorporates a resilient rubber-like flange which is also known as a lip seal.

BACKGROUND OF THE INVENTION

1. Field of the Invention

This invention relates to air seals and more particularly to an air seal between an equipment rack containing air ducts and a removable module or printed wiring assembly having an air passageway.

2. Description of the Prior Art

In the prior art electronic modules such as printed circuit boards have been cooled by forced air. Normally the rack holding the electronic modules also is utilized to contain ducts for carrying air which may be directed through orifices towards the electronic modules and actually through the modules to the other side of the rack for a return air path to an exhaust fan. A very early patent dealing with cross-ventilation is U.S. Pat. No. 2,843,806 which issued on July 15, 1958 to R. J. O'Neill entitled "CROSS-COOLED CABINET FOR ELECTRICAL EQUIPMENT". U.S. Pat. No. 2,843,806 described a cabinet containing air ducts for circulating fresh air along isolated channels to provide a closed cooling system.

An electronic module may, for example, consist of a pair of printed circuit boards which may be riveted or more likely bonded together by means of a frame positioned between the two boards. The frame may enclose the air space between the two printed circuit boards. Holes or ducts in the board frame may permit the passage of cooling air from a supporting rack. One such example is shown in U.S. Pat. No. 3,956,673 which issued on May 11, 1976 to Gordon Seid entitled "PRINTED CIRCUIT MODULES COOLED BY RACK WITH FORCED AIR". In U.S. Pat. No. 3,956,673 a board pair having an enclosed interior air space has air inlet and outlet tubes or hollow pins which extend into openings in the duct carrying air. A grommet is shown for providing a seal between the hollow pin and the duct which may be of rubber or elastomeric material. A small plate is also provided for covering the orifice or grommet when the hollow pin is removed such as when the electronic module is removed.

In U.S. Pat. No. 4,006,388 which issued on Feb. 1, 1977 to W. E. Bartholomew entitled "THERMALLY CONTROLLED ELECTRONIC SYSTEM PACKAGE", a rack is shown for holding electronic modules which has printed circuit boards with air ducts on either side of the electronic modules with openings or orifices in the duct aligned with openings in the electronic module to provide cooling air to the electronic module. The size of the openings in the duct is shown to control the rate of flow of fluid to the electronic module.

In a manufacturing plant at Westinghouse Electric Corporation it has been known to provide a lip seal between a pair of printed circuit boards and a rack containing elongated orifices or openings for providing cooling air to the interior cavity of the pair of printed circuit boards or electronic module. The lip seal was made of rubber and was flexible and extended from the rack conterminous with the elongated orifice which generally extended lengthwise having a uniform width. When the electronic module or printed circuit board was inserted into the rack, the space between the two printed circuit boards was directed or slid along the lip seal such that the lip seal was contiguous with the interior side of both printed circuit boards. For example, a printed circuit board pair would have a connector for making electrical connections on one edge with the two adjacent edges open for the passage of air across the interior space between the boards. The printed circuit board pair would be inserted transverse to the elongated openings or orifices towards the electrical mating connector held in the rack. The lip or flange seals around the orifices of the rack would flex inwardly with each side of the lip seal in contact with the corresponding interior side or surface of the printed circuit board inside the edge as it is being inserted. Normally the printed circuit board pair would be directed along a slot or groove in the rack. The lip seal performed well along the lengthwise direction of the elongated opening or orifice, however, at the ends of the orifice crinkling and buckling of the lip seal was observed providing an inefficient seal from air leaks at the ends. Sometimes the ends were modified by putting in an end stop which would seat against the frame holding the two printed circuit boards together to improve the efficiency of the seal by reducing the air leaks. The crinkling and buckling stems from the aspect ratio of the opening which is large for rectangular slots hence making the end crinkling more secure than in circular type openings.

It is therefore desirable to provide a seal between a removable printed circuit board pair and a rack which is leaktight and leakproof, especially at the ends.

It is further desirable to provide a compression seal which is leaktight and leakproof between a removable electronic module and an equipment rack containing air ducts.

It is further desirable to provide a compression seal which overcomes the problems of crinkling and buckling at the ends of an elongated orifice or slot opening.

SUMMARY OF THE INVENTION

In accordance with the present invention, a compressive air seal between a removable electronic module and a rack containing air ducts is described comprising a first rubber material having a first hardness, a second rubber material overlying said first rubber material having a second hardness which is harder and a cover of thin material having a low friction coefficient overlying said second rubber material for providing wear resistance.

In addition, the compression seal may be mounted on the rack on a tapered surface with respect to the direction of insertion of the electronic module which may have a corresponding tapered surface to provide a sliding compression fit when the opening in the electronic module and the opening in the rack are aligned.

In addition to the compression seal, an electronic module and rack are described having tapered edges to provide engagement of the sides of the electronic module as the electronic module is being inserted into the rack to mate with an electrical connector.

BRIEF DESCRIPTION OF THE DRAWING

FIG. 3 is a cross-section view along the lines III—III of Figure;

FIG. 4 is an underside view of FIG. 1;

FIG. 8 is a plan view of a printed wiring assembly frame;

FIG. 10 is a top view of the frame of FIG. 9;

DESCRIPTION OF THE PREFERRED EMBODIMENT

Figure 1:
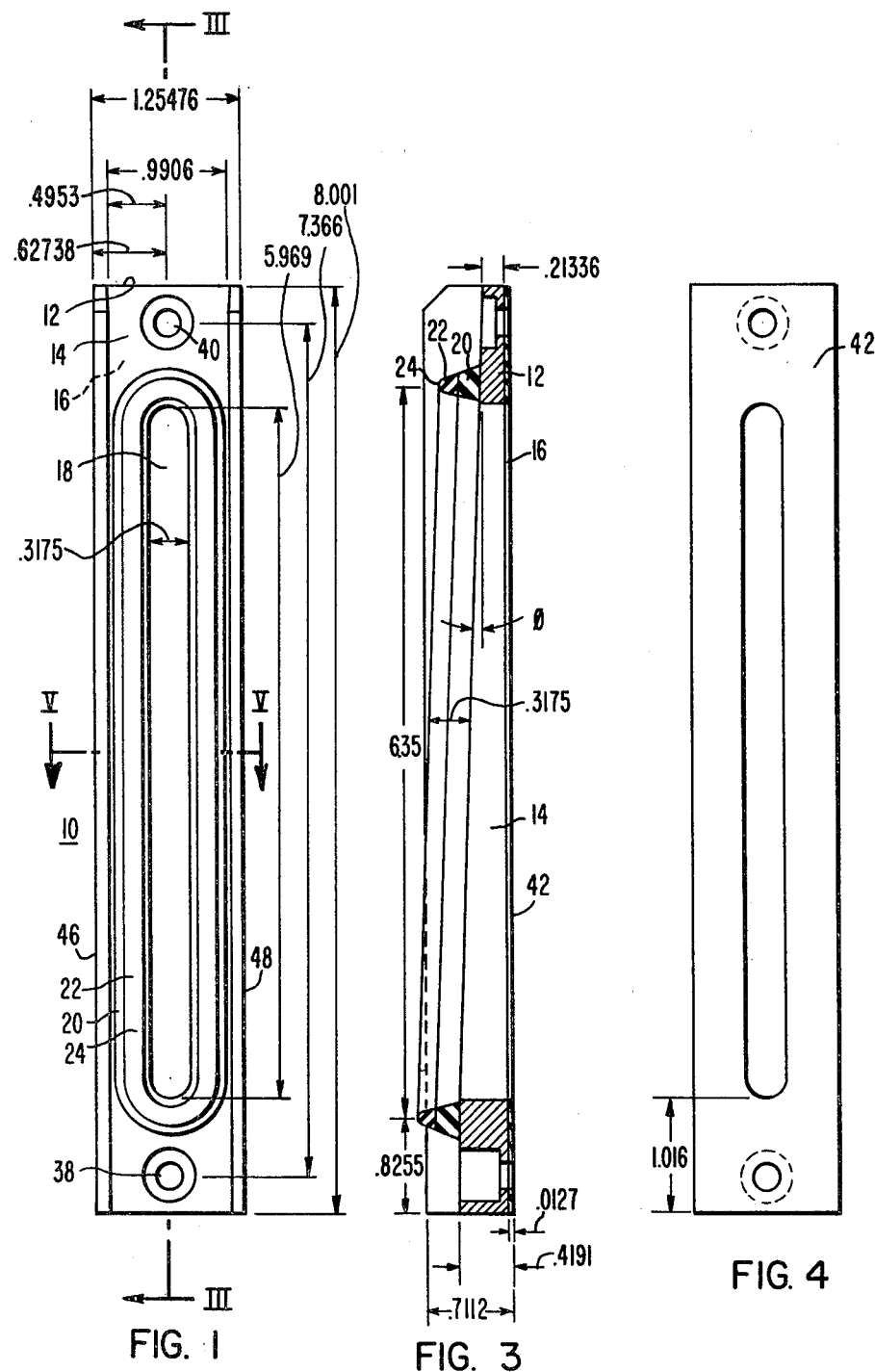
FIG. 1 is a plan view of one embodiment of the invention.
Figure 2:
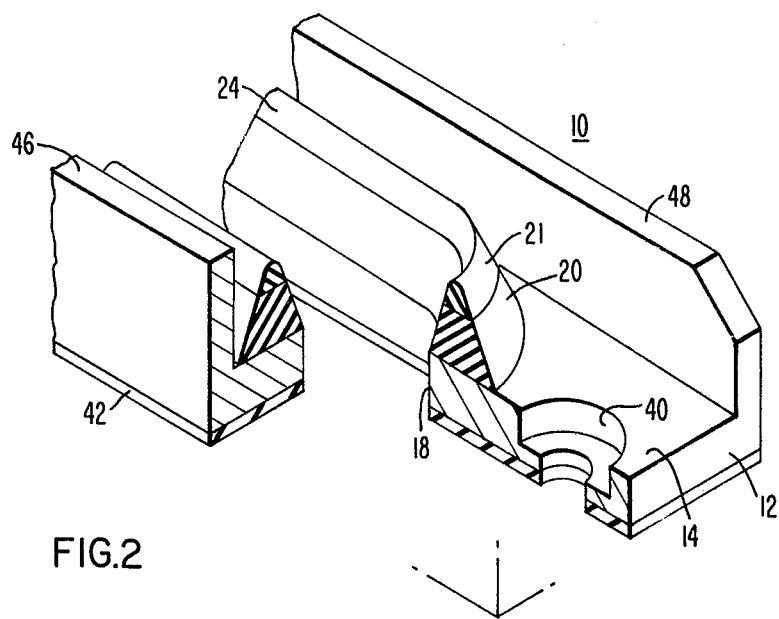
FIG. 2 is a perspective view of FIG. 1 with portions cut away.

Referring to the drawings and in particular to FIGS. 1 through 5 an air seal 10 is shown having a base 12 having a upper surface 14 and a lower surface 16. Base 12 has an opening, slot or orifice 18 which extends from lower surface 16 to upper surface 14. As shown in FIG. 1 opening 18 is 5.969 centimeters long and 0.3175 centimeters wide. The ends of opening 18 are circular having a radius of one-half the width of opening 18. Opening 18 functions to conduct or pass cooling gas or air through base 12. On upper surface 14 and extending around opening 18 is a layer of elastomeric material 20 having a width of, for example, 0.32385 centimeters and a height of 0.165 centimeters which is continuous about a path enclosing opening 18. The hardness of elastomeric material 20 may, for example, be 40 durometer. The sides of elastomeric material 20 may slope inwardly from a width at the base of 0.32385 centimeters to a width at the top of 0.165 centimeters, for example. As shown in FIG. 1 elastomeric material 20 follows a path having two circular ends and straight sides therebetween.

Figure 5:
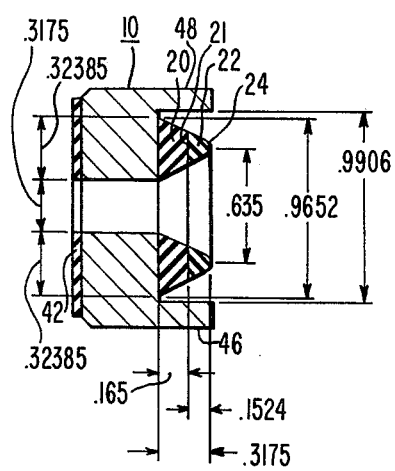
FIG. 5 is a cross-section view along the lines V—V of FIG. 1.

Above elastomeric material 20 on its upper surface 21 is a layor or strip of elastomeric material 22 which extends around opening 18 and on upper surface 21 of elastomeric material 20. The base or lower surface of elastomeric material 22 may, for example, be 0.165 centimeters and have a height of 0.1524 centimeters. The sides of elastomeric material 22 may taper inwardly above base 12 and have a cylindrical surface along the strip of a radius of 0.04064 centimeters. FIG. 5 shows a cross section in detail which is enlarged relative to FIG. 1.

Elastomeric material 22 may, for example, have a hardness of 10 durometer which is soft compared to elastomeric material 20 which has a hardness of 40 durometer which is medium in hardness. A hardness of 80 durometer is considered hard. Elastomeric material 20 and 22 may, for example, be silicone rubber and may be vulcanized at the same time during manufacturing or attachment of the material 20 and 22 to base 12. The outer surface of elastomeric material 22 may be coated with 0.00254 centimeters of a coating 24 to reduce friction and increase wear such as, for example, fluorinated ethylene propylene.

Figure 6:
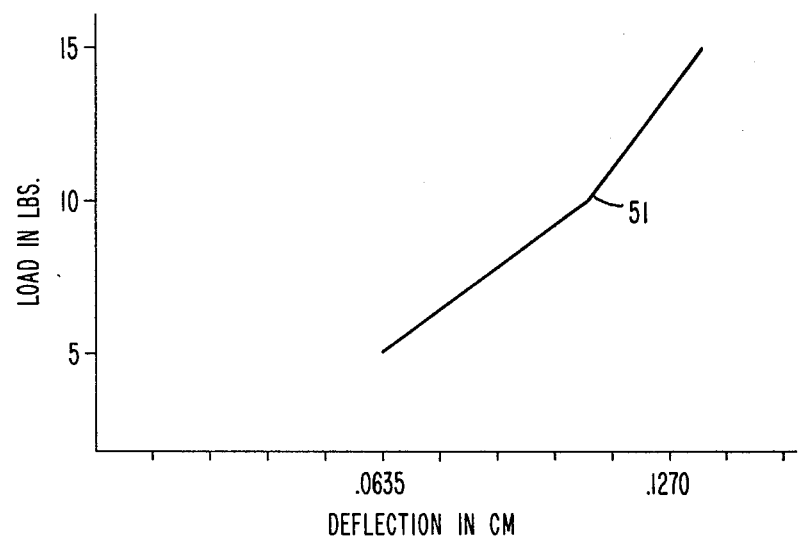
FIG. 6 is a curve showing load versus deflection of one embodiment of the seal of FIG. 1.

The combination of two hardnesses of elastomeric material provides a load versus deflection curve as shown by curve 51 in FIG. 6. The combination of elastomeric materials 20 and 22 were designed to deflect from 0.0254 centimeters to 0.0762 centimeters under a load or force in the range from 2 to 6 pounds. The design was directed to achieve a 0.0508 centimeter deflection with 4 pounds load or force transverse to the seal without buckling or crimping. With the seal in use as shown in FIG. 1, curve 57 was plotted from data obtained by measurements in the laboratory. It has been found that effective air seals have been achieved with a mere 0.00762 centimeters deflection. The air or gas seal 10 has been designed to provide a leaktight and leakproof seal of air under 4 inches of water pressure or differential to the exterior air space.

As can be seen in FIG. 3 upper surface 14 of base 12 is tapered along its length from a height of 0.21336 centimeters relative to lower surface 16 to a height of 0.4191 centimeters. The taper or incline of upper surface 14 shown by angle $\phi$ in FIG. 3 functions to provide deflection of elastomeric materials 20 and 22 upon insertion of a printed wiring assembly which is traveling parallel to lower surface 16 and slides against a matching tapered surface.

The taper or incline, angle $\phi$, of upper surface 14 with respect to lower surface 16 may be, for example, from 1° to 1.5° to permit a gradual engagement of the printed wiring assembly upon insertion. The end point of insertion and the position of the matching tapered surface will determine the deflection of the seal 10.

Openings 38 and 40 are shown for bolting the base 12 to an equipment rack for easy replacement of the seal. Preferably opening 18 would correspond to an opening in the equipment rack for the passage of air from a duct in the equipment rack through opening 18. To facilitate a seal between the lower surface 16 of base 12 and the equipment rack a 0.0127 centimeter elastomeric coating 42 on lower surface 16 is shown in FIGS. 3 and 4.

Figure 12:
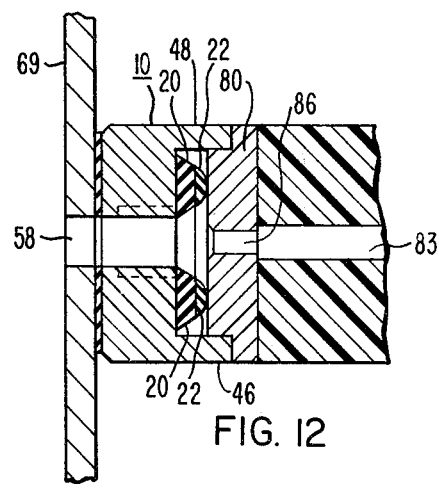
FIG. 12 is a cross-section view taken along the line XII—XII of FIG. 7.

As shown in FIG. 1, base 12 has side flanges 46 and 48 extending the length of base 12 and function to guide an electronic module or a printed wiring assembly between flanges 46 and 48. Side flanges 46 and 48 may, for example, be 0.127 centimeters thick and be spaced apart 0.9906 centimeters to permit a printed wiring assembly frame having ends of 0.9398 centimeters width to be guided by flanges 46 and 48 as it is inserted in an equipment rack as shown in FIG. 12. Final alignment may be accomplished with male keying pins on the electrical connector which engage female sockets on the equipment rack matrix plate. Base 12 may be, for example, fabricated from aluminum or other materials which can adhere to elastomeric material and support the load on the seal.

Figure 7:
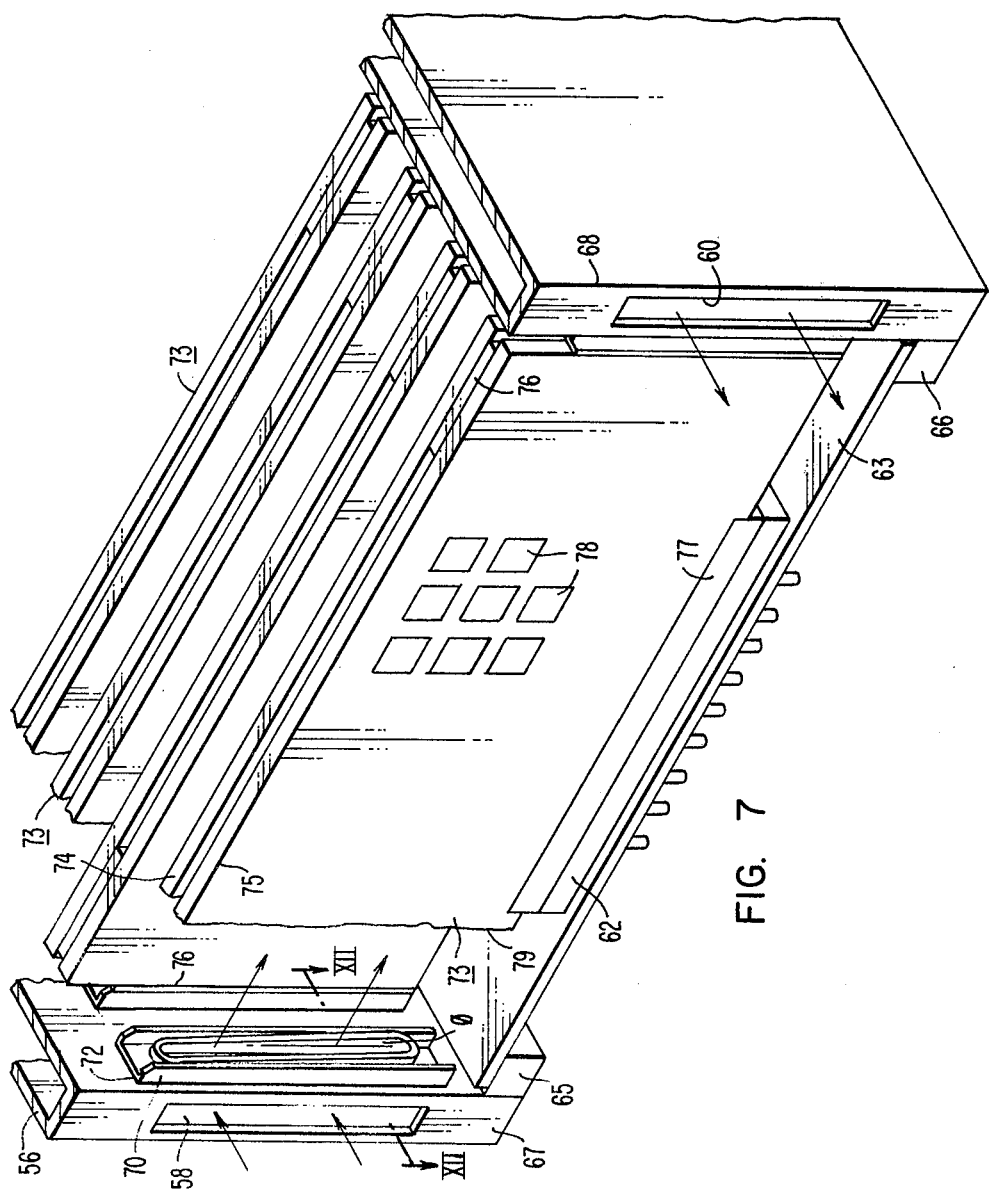
FIG. 7 is a view of a printed wiring assembly in an equipment rack containing air ducts an the air seal of FIG. 1.

FIG. 7 is a view in perspective showing the relationship of a number of printed wiring assemblies 73 in an equipment rack 56 with air seals on two opposite edges or sides and an electrical connector on an edge or side therebetween. Equipment rack 56 includes an air plenum inlet 58, air plenum outlet 60 and electrical connector 62 supported by a matrix plate 63 attached to supports 65 and 66 which, in turn, are attached to sides 67 and 68. Air seal 70 is shown attached to side 67 and air seal 72 is shown attached to side 68. Air seals 70 and 72 may, for example, be air seal 10 shown in FIGS. 1 through 5. A printed wiring assembly 73 comprises printed circuit boards 74 and 75, a frame 76 and electrical connector 77 which mates with connector 62. Frame 76 functions to support printed circuit boards 74 and 75 and at the same time enclose the interior space between printed circuit boards 74 and 75. Frame 76 has orifices or openings on opposite sides which match the openings in air seals 70 and 72 for the passage of air in the enclosed space 79 between printed circuit boards 74 and 75 from inlet 58 to air plenum outlet 60. As shown in FIG. 7 some integrated circuits 78 are shown mounted on the exterior side of printed circuit board 75. It is understood that integrated circuits and other components may be mounted on either side of printed circuit board 74 and 75 depending upon the spacing provided for the components. As can be seen in FIG. 7 air seals 70 and 72 are tapered or inclined at an angle $\phi$ such that the space between air seals 70 and 72 are less as a printed wiring assembly 73 is inserted. Frame 76 has matching tapered surfaces which engage and compress air seals 70 and 72 uniformly as the printed wiring assembly 73 is inserted to its end point.

In a typical wiring assembly 73, connector 77 will have an insertion force to mate with connector 62 of approximately 55 to 60 pounds pressure which is large in comparison to the insertion pressure required to deflect air seals 70 and 72 provided a low coefficient of friction coating 24 is used and angle $\phi$ is small.

Figure 9:
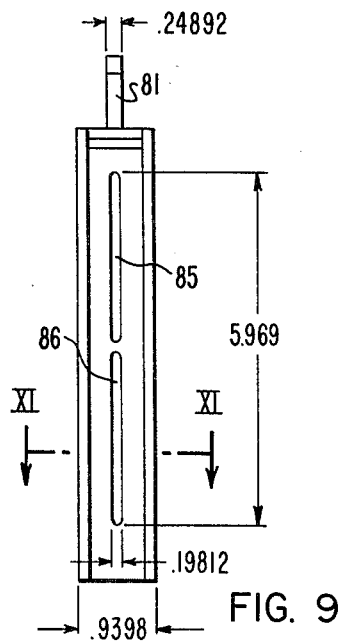
FIG. 9 is a side view of the printed wiring assembly frame of FIG. 8.
Figure 11:
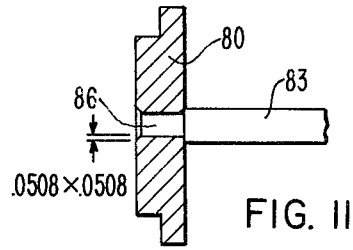
FIG. 11 is a cross-section view along the lines XI—XI of FIG. 9.

FIG. 8 is a plan view of a printed wiring assembly frame such as frame 76 in FIG. 7. FIG. 9 is a side view of frame 76 showing the openings for the passage of air. Frame 76 may, for example, be aluminum and has sides 80 and 82 which seat against air seals 70 and 72. Top side 81 functions to support printed circuit boards 74 and 75 and to prevent the leakage of air out the top side. Bottom side 83 functions to hold connector 77 and prevent air from leaking out the bottom side. In addition, top and bottom sides 81 and 83 function to support the printed circuit boards 74 and 75 which are riveted to sides 81 and 83 sandwiching sides 81 and 83 between. FIG. 10 shows a top view of printed wiring assembly frame 76 shown in FIG. 8. In order to facilitate the engagement of air seals 70 and 72 the exterior surface of sides 80 and 82 are finished or polished to a smoothness of 64 micro-inches. To prevent damage to air seals 70 and 72 openings 85 and 86 have the edges beveled at a 45° angle such as shown in FIG. 11. In FIG. 11 the bevel shows it extends 0.0508 centimeters along the surface from the edge of the slots 85 and 86 and 0.0508 centimeters in depth along the slots 85 and 86.

Frame 76 in FIG. 8 shows that sides 80 and 82 are tapered at an angle $\phi$ to correspond to the taper of the air seals 70 and 72. Any machining tolerance variation in these corresponding angles $\phi$ is taken up by the seal compression.

The invention provides an equipment rack utilizing a tapered air seal in an electronic module having a tapered surface for contact with the air seal for the passage of cooling air or gas through electronic modules such as a printed wiring assembly.

An air seal has been described including a base having a lower surface adapted for attachment to an equipment rack and having an upper surface, the base having an opening or slot from the lower surface to the upper surface for the passage of cooling air therethrough. A flexible seal comprising dual durometer elastomeric material provides a closed path around the opening or slot attached to the upper surface and wherein the upper surface is inclined with respect to the lower surface to provide a taper for compression of the seal by a matching tapered surface during insertion of a printed wiring assembly transverse to the seal in the direction of the taper.

What is claimed is:

1. An air seal comprising:
   a base having a lower surface and an upper surface inclined with respect to said lower surface;
   said base having an opening from said lower to said upper surface for the passage of air;
   a first layer of elastomeric material attached to said upper surface positioned in a closed path around said opening; and
   a second layer of elastomeric material attached to the upper surface of said first layer of elastomeric material overlying said closed path around said opening.

2. The air seal of claim 1 wherein said opening is an elongated slot.

3. The air seal of claim 1 wherein said lower surface is inclined with respect to said upper surface in the range from 1° to 1.5°.

4. The air seal of claim 1 wherein said first layer of elastomeric material is conterminous with said opening.

5. The air seal of claim 1 wherein said first layer of elastomeric material includes silicone rubber.

6. The air seal of claim 1 wherein said first layer of elastomeric material is of medium hardness of approximately 40 durometer.

7. The air seal of claim 1 wherein said second layer of elastomeric material includes silicone rubber.

8. The air seal of claim 1 wherein said second layer of elastomeric material is softer than said first layer of elastomeric material.

9. The air seal of claim 1 wherein said second layer of elastomeric material is soft at approximately 10 durometer.

10. The air seal of claim 1 further including a coating on the upper surface of said second layer of elastomeric material to reduce friction.

11. The air seal of claim 10 wherein said coating includes fluorinated ethylene propylene.

12. The air seal of claim 1 further including a layer of elastomeric material on said lower surface positioned in a closed path around said opening.

13. The air seal of claim 1 wherein said first layer of elastomeric material has side walls which taper inwardly above said upper surface.

14. The air seal of claim 1 wherein said second layer of elastomeric material has side walls which taper inwardly above said first layer.

15. The air seal of claim 1 wherein said second layer of elastomeric material has a truncated cylindrical upper surface between two side walls.

16. The air seal of claim 1 wherein said closed path has two circular ends coupled by two straight lines opposite each other.

17. Apparatus for coupling air between a chassis having an air duct and a removable module having an air cavity comprising:

means for engaging said module with said chassis including means for sliding said module along a path toward a predetermined position;

an air seal extending from said chassis to said module when said module is in said predetermined position;

said air seal including a base having a lower surface attached to said chassis and having an upper surface inclined with respect to said lower surface;

said base having an opening from said lower to said upper surface for the passage of air;

a first layer of elastomeric material attached to said upper surface positioned in a closed path around said opening;

a second layer of elastomeric material attached to the upper surface of said first layer of elastomeric material overlying said closed path around said opening;

said first and second layers of elastomeric material compressed below their normal height at times said module is in said predetermined position;

first means for coupling said opening to said air duct; and second means for coupling said opening to said air cavity at times said module is in said predetermined position.

18. The apparatus of claim 17 wherein said second means for coupling includes a flat surface inclined with respect to the direction of sliding said module in contact with said second layer of elastomeric material and having an opening within said closed path at times said module is in said predetermined position.

19. The apparatus of claim 18 wherein said flat surface has beveled edges on said opening.

20. The apparatus of claim 17 further including a coating on the upper surface of said second layer of elastomeric material to reduce friction.

* * * * *